(12) United States Patent
Cha et al.

(10) Patent No.: US 12,167,632 B2
(45) Date of Patent: Dec. 10, 2024

(54) DISPLAY MODULE AND DISPLAY DEVICE

(71) Applicant: LG Display Co., Ltd., Seoul (KR)

(72) Inventors: Jongseok Cha, Goyang-si (KR); Dongwon Jang, Goyang-si (KR); Buhui Lee, Gumi-si (KR); Junho Yun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 444 days.

(21) Appl. No.: 17/528,457

(22) Filed: Nov. 17, 2021

(65) Prior Publication Data

US 2022/0181576 A1    Jun. 9, 2022

(30) Foreign Application Priority Data

Dec. 8, 2020   (KR) .......................... 10-2020-0170084

(51) Int. Cl.
| | | |
|---|---|---|
| H01L 51/52 | (2006.01) | |
| H05K 1/02 | (2006.01) | |
| H05K 1/18 | (2006.01) | |
| H10K 50/84 | (2023.01) | |
| H10K 50/87 | (2023.01) | |
| H10K 102/00 | (2023.01) | |

(52) U.S. Cl.
CPC ............ *H10K 50/87* (2023.02); *H05K 1/028* (2013.01); *H05K 1/189* (2013.01); *H10K 50/84* (2023.02); *H10K 2102/311* (2023.02)

(58) Field of Classification Search
CPC .. H10K 50/87; H10K 50/84; H10K 2102/311; H10K 59/8794; H10K 59/87; H10K 2102/351; H10K 77/111; H10K 59/131; H05K 1/028; H05K 1/189; G09F 9/30; B32B 5/18; B32B 27/065; B32B 27/36; B32B 2457/20

See application file for complete search history.

(56) References Cited

U.S. PATENT DOCUMENTS

| | | | |
|---|---|---|---|
| 9,818,974 | B2 | 11/2017 | Kwon et al. |
| 10,678,387 | B2 | 6/2020 | Oh |
| 10,802,629 | B2 | 10/2020 | Jeon et al. |
| 10,820,421 | B2 | 10/2020 | Huang et al. |
| 10,957,867 | B2 | 3/2021 | Jeong |
| 2017/0148859 | A1* | 5/2017 | Nishinohara ........ H10K 50/841 |

(Continued)

FOREIGN PATENT DOCUMENTS

| | | |
|---|---|---|
| CN | 205303466 U | 6/2016 |
| CN | 106887186 A | 6/2017 |

(Continued)

*Primary Examiner* — Mohammed R Alam
(74) *Attorney, Agent, or Firm* — Seed IP Law Group LLP

(57) ABSTRACT

Disclosed are a display module and a display device capable of minimizing a pressed stain defect while reducing a bezel area. To this end, a thickness of a cushion portion of a cushion plate closer to a bent portion may be reduced, thereby reducing a bending radius of curvature such that the bezel area may be reduced. Further, placing a support layer having a strong supporting force formed of PET into the cushion plate such that the support layer is in contact with the heat-dissipation layer may allow minimizing an unevenness defect on the cushion plate even when a bent pad portion of a display panel presses the cushion portion. Thus, visibility of an internal pressed stain to a user may be minimized.

17 Claims, 12 Drawing Sheets

(56) References Cited

U.S. PATENT DOCUMENTS

2018/0182829 A1     6/2018   Shin et al.
2020/0310577 A1*   10/2020   Jeon ........................ H10K 59/12

FOREIGN PATENT DOCUMENTS

| CN | 108878474 | A | 11/2018 |
|----|-----------|---|---------|
| CN | 109541834 | A | 3/2019 |
| CN | 211528859 | U | 9/2020 |
| KR | 10-2019-0069662 | A | 6/2019 |
| KR | 10-2019-0105682 | A | 9/2019 |
| KR | 10-2019-0107235 | A | 9/2019 |
| KR | 10-2020-0124483 | A | 11/2020 |
| KR | 20200124483 | A | 11/2020 |
| KR | 20200129646 | A | 11/2020 |
| KR | 20220056483 | A | 5/2022 |

* cited by examiner

362

DISPLAY MODULE AND DISPLAY DEVICE

CROSS-REFERENCE TO RELATED APPLICATION

This application claims priority to Korean Patent Application No. 10-2020-0170084 filed on Dec. 8, 2020, in the Korean Intellectual Property Office, the entire disclosure of which is incorporated herein by reference.

BACKGROUND

Technical Field

The present disclosure relates to a display module and a display device, and more specifically, a display module and a display device capable of minimizing a pressed stain defect while reducing a bezel area.

Description of the Related Art

A display device is implemented in a wide variety of forms as in televisions, monitors, smart phones, tablet PCs, notebook computers, and wearable device.

In general, the display device includes a display area displaying a screen and a non-display area along an outer periphery of the display area.

The display device may include various additional parts such as a driving integrated circuit or a circuit board in addition to a display panel to display the screen.

In the non-display area, additional parts may be disposed, or various connection parts such as a flexible circuit board for connecting the additional parts to each other may be disposed.

In the display device, the non-display area is also referred to a bezel area. When the bezel area is wide, a user's gaze may be distracted. However, when the bezel area is narrow, the user's gaze may focus on the screen of the display area such that user immersion increases.

In other words, when the bezel area becomes narrower, an entire size of the display device may be reduced while increasing the user immersion. Accordingly, demand from the user for the display device that may reduce the bezel area as much as possible is increasing.

BRIEF SUMMARY

In the display device, not only a pad of the display panel but also various additional parts such as the driving integrated circuit and the circuit board may be disposed on a bottom surface of the display panel in order to secure the display area as large as possible and to ensure the minimum bezel area.

In this case, the various additional components may be mounted on or connected to a connection component such as a flexible circuit board and may be disposed on the bottom surface of the display panel.

For example, the flexible circuit board connected to one distal end of the display panel may be bent in a direction from the bezel area to the bottom surface of the display panel.

Alternatively, as one distal end of the display panel is bent toward the bottom surface of the display panel, the various additional parts may be disposed on the bottom surface of the display panel.

In this case, when a bending radius of curvature increases, the flexible circuit board or display panel may be bent more stably and easily. However, as the bending radius of curvature increases, the bezel area increases, and a total width of the display device increases.

A cushion plate for heat-dissipation and shock absorption which includes a heat-dissipation layer as a metal layer and a cushion layer adhered to the heat-dissipation layer and having a predefined thickness may be disposed on the bottom surface of the display panel.

In this case, in order to reduce a bending radius of curvature of the bezel area, a thickness of the cushion layer close to the bezel area may be smaller, and accordingly, the heat-dissipation layer bonded to a bottom surface of the thinned cushion layer has a step.

While the step is present, a strong tension is applied to the heat-dissipation layer bonded to the cushion layer.

When such a strong tension acts on the heat-dissipation layer, the heat-dissipation layer may not be uniformly and evenly adhered to the cushion layer, and accordingly, an unevenness defect occurs between the heat-dissipation layer and the cushion layer.

In particular, when a pad of the display panel is bent and positioned under the bottom surface of the display panel, the bent pad of the display panel presses the cushion layer. Thus, the unevenness defect becomes more severe due to this additional pressure.

When the unevenness defect becomes severe, a user of the display device visually recognizes an inner pressed stain around an area pressed by the bent pad of the display panel.

Accordingly, the inventors of the present disclosure have invented a display module and a display device that may minimize the pressed stain defect while reducing the bezel area.

A purpose to be achieved according to an embodiment of the present disclosure is to provide a display module and a display device capable of reducing a bezel area.

A purpose to be achieved according to an embodiment of the present disclosure is to provide a display module and a display device capable of reducing a magnitude of tension acting on a cushion portion of a cushion plate positioned on a bottom surface of a display panel.

A purpose to be achieved according to an embodiment of the present disclosure is to provide a display module and display device capable of minimizing an unevenness defect of a cushion plate disposed on a bottom surface of a display panel.

A purpose to be achieved according to an embodiment of the present disclosure is to provide a display module and a display device capable of minimizing an internal pressed stain as visually recognized by a user.

Purposes to be achieved according to an embodiment of the present disclosure are not limited to the purpose as mentioned above. Other purposes that are not mentioned may be clearly understood by those skilled in the art based on following descriptions.

A display module according to an embodiment of the present disclosure includes a display panel including a front portion, a bent portion, and a pad portion extending from the bent portion and disposed below a bottom surface of the front portion, a cushion plate disposed between the front portion and the pad, and a bent panel fixing member that fixes or connects the pad portion to the cushion plate.

In this case, the cushion plate includes an embossed layer; first and second cushion portions disposed under the embossed layer, the first cushion portion including a first cushion layer, and the second cushion portion including a second cushion layer and a second support layer; and a heat-dissipation layer disposed under the first cushion portion and the second cushion portion.

The second cushion portion has a thickness smaller than that of the first cushion portion, and is spaced apart from the first cushion portion and is closer to the bent portion than the first cushion portion is. In addition, the second cushion layer is in contact with the embossed layer, and the second support layer is in contact with the heat-dissipation layer, and the second support layer includes PET material.

As described above, when the second cushion portion having a thickness smaller than that of the first cushion portion is spaced apart from the first cushion portion and is closer to the bent portion than the first cushion portion is, thereby reducing the tension applied to the heat-dissipation layer while reducing the bezel area.

Further, the second cushion portion includes the second cushion layer and the second support layer, wherein the second support layer contacts the heat-dissipation layer, such that the unevenness defect of the cushion plate is minimized, and the internal pressed stain which is visible to the user is minimized.

A display device according to an embodiment of the present disclosure includes a cover member, a display module according to an embodiment of the present disclosure coupled to a bottom surface of the cover member, and a frame disposed on a bottom surface of the display module to support the cover member.

According to an embodiment of the present disclosure, a thickness of the cushion portion of the cushion plate disposed closer to the bent portion may be reduced, thereby reducing the bending radius of curvature such that the bezel area may be reduced.

Further, according to an embodiment of the present disclosure, when a step is formed on the heat-dissipation layer bonded to bottom surfaces of the first cushion portion and the second cushion portion having different thicknesses, the first cushion portion and the second cushion portion may be spaced apart from each other, thereby distributing the tension toward a portion of the heat-dissipation layer corresponding to the first cushion portion, and thus reducing the magnitude of the tension applied to a portion of the heat-dissipation layer corresponding to the second cushion portion.

Further, according to an embodiment of the present disclosure, placing the support layer having a strong supporting force formed of PET into the cushion plate such that the support layer is in contact with the heat-dissipation layer in the cushion plate may allow minimizing the unevenness defect on the cushion plate, compared to a structure in which the cushion layer having a weak supporting force contacts the heat-dissipation layer.

Further, according to an embodiment of the present disclosure, placing the support layer having a strong supporting force formed of PET into the cushion plate such that the support layer is in contact with the heat-dissipation layer in the cushion plate may allow minimizing the unevenness defect on the cushion plate even when the bent pad portion of the display panel presses the cushion portion. Thus, the visibility of the internal pressed stain to the user may be minimized.

Effects of the present disclosure are not limited to the above-mentioned effects, and other effects as not mentioned will be clearly understood by those skilled in the art from following descriptions.

DETAILED DESCRIPTION

Figure 1A:
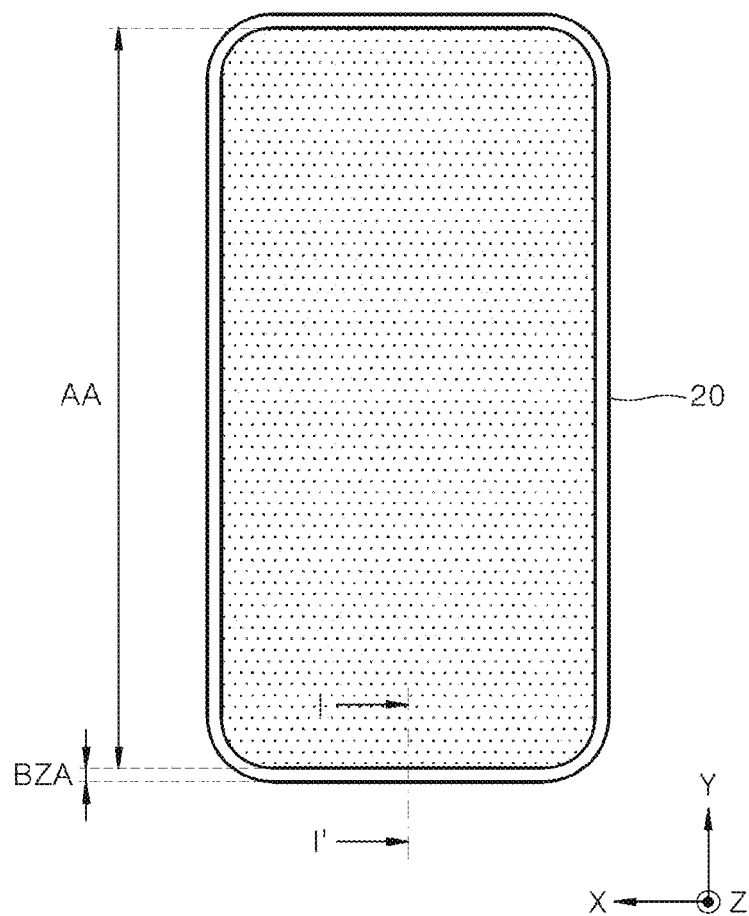
FIGS. 1A and 1B respectively show a top surface and a bottom surface of a display device according to an embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs.

A shape, a size, a ratio, an angle, a number, etc., disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

In descriptions of temporal relationships, for example, temporal precedent relationships between two events such as "after," "subsequent to," "before," etc., another event may occur therebetween unless "directly after," "directly subsequent" or "directly before" is not indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Hereinafter, various configurations of a display module and a display device that may minimize a pressed stain defect while reducing a bezel area will be described in detail.

Figure 1B:
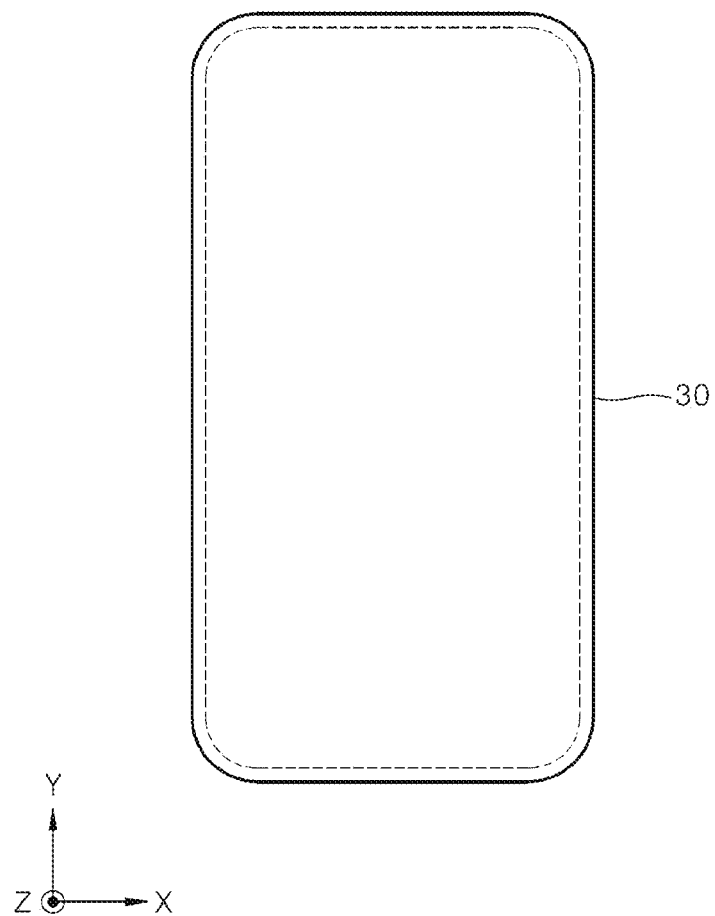

FIG. 1A briefly shows a top surface of a display device 1 on which a display area AA is disposed, and FIG. 1B briefly shows a bottom surface of display device 1.

The display device 1 includes a cover member 20, a display module 10 coupled to a bottom surface of cover member 20, and a frame 30 disposed on a bottom surface of display module 10 to support the cover member 20. The display module 10 and the cover member 20 may be disposed in the frame 30.

The cover member 20 may be disposed to cover a top surface of the display module 10, and thus may protect the display module 10 from external shocks.

An edge of the cover member 20 may have a round shape in which the edge thereof is curved toward a bottom surface thereof on which the display module 10 is disposed.

In this case, the cover member 20 may cover at least a partial area of a side surface of display module 10 disposed on the bottom surface thereof, thus protecting not only a top surface of the display module 10, but also the side surface thereof from an external shock.

The cover member 20 includes the display area AA that displays a screen, and thus may be formed of a transparent material such as a cover glass to display the screen. For example, the cover member 20 may be formed of a transparent plastic material, a glass material, or a reinforced glass material.

The frame 30 may contact the bottom surface and side surfaces of the display module 10 so that the display module 10 is accommodated therein.

The frame 30 serves as a housing that defines a bottom surface of the display device 1, and may be formed of various materials such as plastic, metal, or glass.

In this case, the frame 30 may function as a casing defining an outermost portion of display device 1. However, embodiments of the present disclosure are not limited thereto.

For example, the frame 30 may function as a middle frame that serves as a housing that forms the bottom surface of display module 10, and there may be an additional casing on the bottom surface of the frame 30.

Further, the top surface of the cover member 20 may be divided into the display area AA and the non-display area NAA as an area other than the display area AA.

The non-display area NAA may be formed along an edge of the display area AA, and the non-display area NAA may be defined as a bezel area BZA.

The display module 10 may have a bent portion BND coupled to the bottom surface of the cover member 20. The bent portion BND may be disposed in the bezel area BZA blow the cover member 20 in a Y-axis direction.

In order to reduce the bezel area BZA under the cover member 20, it is necessary to reduce a radius of curvature of the bent portion BND.

The radius of curvature of the bent portion BND is proportional to a total thickness of the display module 10 and the display device 1. Thus, as the total thickness increases, the radius of curvature of the bent portion BND increases. When the total thickness decreases, the radius of curvature of the bent portion BND decreases.

Therefore, in order not to increase the size of the bezel area BZA, it is necessary to prevent the total thickness of display module 10 and the display device 1 from increasing.

Hereinafter, the display module 10 according to an embodiment of the present disclosure will be described in detail with reference to FIG. 2.

The display module 10 is coupled to the bottom surface of the cover member 20.

The display module 10 includes a display panel 100 including a front portion FP, a bent portion BND, and a pad portion PAD extending from the bent portion BND and disposed below a bottom surface of the front portion FP, a cushion plate 300 disposed between the front portion FP and the pad portion PAD, and a bent panel fixing member (or a bent panel connection member or a first connection member or a connection member) 400 that fixes or connects the pad portion PAD to the cushion plate 300.

Specifically, under the front portion FP of the display panel 100, a first backplate (or a first plate or a first base plate) 210, the cushion plate 300, the bent panel fixing member 400, a second backplate (or a second plate or a second base plate) 220, and the pad portion PAD may be sequentially stacked in this order.

First, the display module 10, specifically a module fixing member (or a module connection member or a connection member or a second connection member) 150 that fixes or connects the display panel 100 to the cover member 20 is placed on the bottom surface of the cover member 20.

Since the module fixing member 150 may be disposed to overlap the display area AA, the module fixing member 150 may be embodied as a transparent adhesive member. For example, the module fixing member 150 may be formed of or include a material such as OCA (Optically Cleared Adhesive), OCR (Optically Cleared Resin), or PSA (Pressure Sensitive Adhesive).

A functional film 140 may be additionally disposed between the module fixing member 150 and the display panel 100. The functional film 140 may have a structure in which one or more functional layers are stacked one on top of another, but is not particularly limited.

In one example, the functional film 140 may include an antireflection layer such as a polarizing film that prevents reflection of external light to improve an outdoor visibility and a contrast ratio for an image displayed on the display panel 100.

In addition, in one example, the functional film 140 may further include a barrier layer for preventing moisture or oxygen invasion. The barrier layer may be formed of a material having low moisture permeability, such as a polymer material.

The display panel 100 may include a display substrate 110, a pixel array 120 disposed on the display substrate 110, and an encapsulation portion 130 disposed to cover the pixel array 120.

The display substrate 110 may serve as a base substrate of the display panel 100. The display substrate 110 may be formed of a flexible plastic material and thus may act as a flexible display substrate.

In one example, the display substrate may be formed of polyimide as a plastic material having flexibility, or may be formed of a thin-type glass material having flexibility.

The pixel array 120 may correspond to an area for displaying the image toward the top surface of the cover member 20, and thus may correspond to the display area AA.

Therefore, the area corresponding to the pixel array 120 in the cover member 20 may be the display area AA, and the area other than the display area AA may be the bezel area BZA.

The pixel array 120 may be implemented using various elements that display an image, and may not be particularly limited.

The pixel array 120 may include a plurality of pixels that are arranged in a pixel area defined by signal lines on the display substrate 110, and display an image according to signals supplied to the signal lines. The signal lines may include a gate line, a data line, and a pixel driving power line.

Each of the plurality of pixels may include a driving thin film transistor in the pixel area, an anode electrically connected to the driving thin film transistor, a light-emissive element layer formed on the anode, and a cathode electrically connected to the light-emissive element layer.

The driving thin film transistor may include a gate electrode, a semiconductor layer, a source electrode, a drain electrode, and the like. The semiconductor layer of the thin film transistor may include silicon such as a-Si, poly-Si, or low-temperature poly-Si, or an oxide such as IGZO (Indium-Gallium-Zinc-Oxide).

The anode may be disposed in each pixel in a corresponding manner to an opening area defined according to a pattern shape of a pixel, and may be electrically connected to the driving thin film transistor.

In one example, the light-emissive element layer may include an organic light-emissive element formed on the anode. The organic light-emissive element may be implemented to emit light of the same color such as white light across the pixels or may be implemented to emit light of different colors such as red, green, and blue light across the pixels.

In another example, the light-emissive element layer may include a micro light-emissive diode element electrically connected to each of the anode and the cathode. The micro light-emissive diode element refers to a light-emissive diode implemented in a form of an integrated circuit (IC) or a chip, and may include a first terminal electrically connected to the anode and a second terminal electrically connected to the cathode.

The cathode may be commonly connected to a light-emissive element of a light-emissive element layer disposed in each pixel area.

The encapsulation portion 130 is formed on the display substrate 110 to cover the pixel array 120, such that oxygen, moisture, or foreign substances may be prevented from invading into the light-emissive element layer of the pixel array 120. In one example, the encapsulation portion 130 may be formed in a multilayer structure in which organic material layers and inorganic material layers are alternately stacked one on top of another.

The display panel 100 may be divided into the front portion FP, the bent portion BND, and the pad portion PAD.

The front portion FP of the display panel 100 constitutes a surface screen on which an image is displayed. The pad portion PAD extends from the bent portion BND under a bottom of the front portion FP, and thus is disposed under the front portion FP.

Specifically, when the display panel 100 is bent, the pixel array 120 and the encapsulation portion 130 constitute the front portion FP and thus are not bent, and a partial area of the display substrate 110 corresponding to the pad portion PAD is bent from the bent portion BND toward the bottom surface of the front portion FP.

The first backplate 210 may be disposed under the front portion FP of the display panel 100.

The first backplate 210 is disposed under the display substrate 110 to supplement rigidity of the display substrate 110, while maintaining a portion of the display substrate 110 constituting the front portion FP in a flat state.

Since the first backplate 210 is formed to have a certain strength and a certain thickness to supplement the rigidity of the display substrate 110, the first backplate 120-210 may not be formed in a portion of the display panel 100 constituting the bent portion BND.

In one example, the second backplate 220 is disposed on a top surface of the pad portion PAD of the display panel 100 which extends from the bent portion BND of the display panel 100 and is disposed below the bottom surface of the front portion FP.

Before the display panel 100 is bent, the second backplate 220 is placed on a bottom surface of the display substrate 110 and is spaced apart from the first backplate 210.

Specifically, the second backplate 220 is placed on a bottom surface of the pad portion PAD of the display panel 100.

The second backplate 220 is disposed on a bottom surface of the display substrate 110 to supplement the rigidity of the display substrate 110, while maintaining a portion of the display substrate 110 constituting the pad portion PAD in a flat state.

Since the second backplate 220 is formed to have a certain strength and a certain thickness to supplement the rigidity of the display substrate 110, the second backplate 220 may not be formed in a portion of the display panel 100 corresponding to the bent portion BND.

After the display panel 100 is bent, the second backplate 220 is placed on a top surface of the pad portion PAD of the display panel 100, and is disposed between the front portion FP and the pad portion PAD. In other words, while the display panel 100 is bent, the second backplate 220 is placed under the front portion FP of the display panel 100, and is placed on a top surface of the pad portion PAD of the display panel 100.

The cushion plate 300 is disposed under the first backplate 210.

Figure 2:
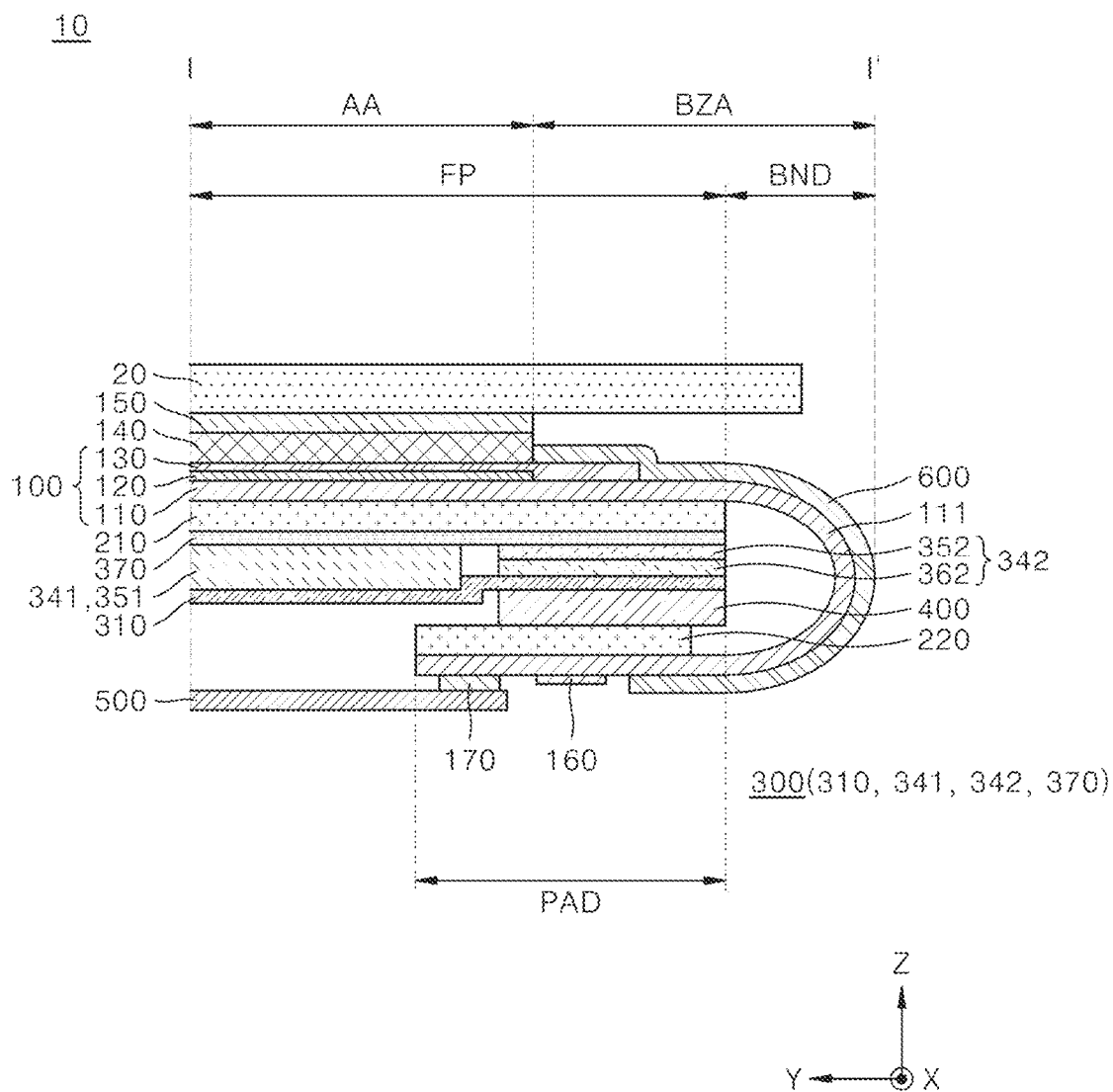
FIG. 2 is a cross-sectional view of a display module according to an embodiment of the present disclosure.

In one example, the cushion plate 300 includes an embossed layer 370, a first cushion portion 341 and a second cushion portion 342 disposed under the embossed layer 370, and a heat-dissipation layer 310 disposed under the first cushion portion 341 and the second cushion portion 342, as shown in FIG. 2.

That is, the cushion plate 300 may have a structure in which the heat-dissipation layer 310, the first cushion portion 341 and the embossed layer 370 are sequentially stacked in a Z-axis direction in a first stack and the heat dissipation layer 310, a second cushion portion 342, and the embossed layer 370 are sequentially stacked in the Z-axis direction in a second stack that is spaced from the first stack in a Y-axis direction.

The embossed layer 370 may be adhered to a first back plate 210, and may be an adhesive layer having an embossed pattern.

The embossed pattern of the embossed layer 370 may be, for example, an uneven structure formed on an surface thereof.

The embossed pattern of the embossed layer 370 prevents bubbles from being generated between the first backplate 210 and the cushion plate 300 when the cushion plate 300 is attached to the first backplate 210, thereby omitting a defoaming process to remove the bubbles.

The embossed layer 370 may directly contact the first backplate 210 to fix or connect the cushion plate 300 to the first backplate 210, and may function as an adhesive layer including an adhesive component.

The embossed layer 370 may be formed of or include a material such as OCA (Optically Cleared Adhesive), OCR (Optically Cleared Resin), or PSA (Pressure Sensitive Adhesive).

The embossed layer 370 may have a thickness of at least 40 μm for adhesive function and bubble prevention.

The first cushion portion 341 including a first cushion layer 351 and the second cushion portion 342 including a second cushion layer 352 and a second support layer 362 are disposed under the embossed layer 370.

The second cushion portion 342 has a thickness smaller than that of the first cushion portion 341, is spaced apart from the first cushion portion 341, and is closer to the bent portion BND of the display panel than the first cushion portion 341 is.

The first cushion portion 341 and the second cushion portion 342 may be on a same plane with respect to the embossed layer 370.

The second cushion layer 352 of the second cushion portion 342 is disposed on a top surface of the second support layer 362, such that the second cushion layer 352 may contact the embossed layer 370, and the second support layer 362 may contact the heat-dissipation layer 310.

The top surface and the bottom surface of the first cushion portion 341 may contact the embossed layer 370 and the heat-dissipation layer 310, respectively.

The second cushion layer 352 is formed to have a thickness smaller than that of the first cushion layer 351.

Each of the first cushion layer 351 and the second cushion layer 352 may be embodied as a foam tape or a foam pad. The first cushion layer 351 and the second cushion layer 352 may function to alleviate the impact to various parts that may contact the cushion plate 300.

The first cushion layer 351 and the second cushion layer 352 having the impact reduction function may reinforce the rigidity of the cushion plate 300.

Each of the first cushion layer 351 and the second cushion layer 352 may have a thickness of at least 80 μm or greater to have an effective impact reduction function and an effective rigidity reinforcing effect.

The second support layer 362 of the second cushion portion 342 may include a hard material that may impart a strong supporting force to the heat-dissipation layer 310 disposed below the second support layer 362.

In one example, the second support layer 362 may include PET material.

Figure 4:
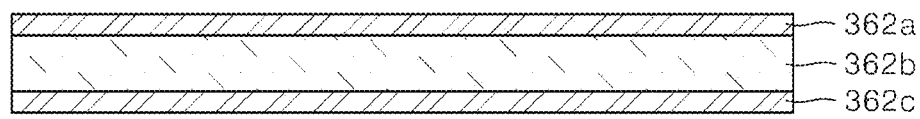
FIG. 4 is an enlarged cross-sectional view of a second support layer according to an embodiment of the present disclosure.

Further, the second support layer 362 may have a sequentially stacked structure of a first supporting adhesive layer 362a, a second support body layer 362b, and a second support adhesive layer 362c, as shown in FIG. 4.

In this case, each of the first support adhesive layer 362a and the second support adhesive layer 362c may include an adhesive material having a minimum thickness configured to fix or connect the layers to each other.

In one example, each of the first support adhesive layer 362a and the second support adhesive layer 362c may be formed of or include a material such as OCA (Optically Cleared Adhesive), OCR (Optically Cleared Resin), or PSA (Pressure Sensitive Adhesive).

In this case, the second support body layer 362b may include a hard material that may impart a strong supporting force to the heat-dissipation layer 310 disposed below the second support body layer 362b. In order to ensure an enough supporting force, a thickness of the second support body layer 362b may be 40 μm or greater.

In one example, the second support body layer 362b may include PET material.

The heat-dissipation layer 310 is disposed under the first cushion portion 341 and the second cushion portion 342.

The heat-dissipation layer 310 may be used for improving a heat-dissipation effect of a component generating a high temperature heat, and may include a material having a high thermal conductivity.

In an example, the heat-dissipation layer 310 may include at least one material selected from copper (Cu), aluminum (Al), and graphite.

In addition, the heat-dissipation layer 310 may have electrical conductivity, and thus may have a heat-dissipation function as well as a grounding function and a function to protect the bottom surface of the display substrate 110.

The heat-dissipation layer 310 is disposed under the first cushion portion 341 and the second cushion portion 342. Since the second cushion portion 342 has a smaller thickness than that of the first cushion portion 341, the heat-dissipation layer 310 may have a step in an area corresponding to the second cushion portion 342. Alternatively, the heat-dissipation layer may has a step between the first cushion portion and the second cushion portion.

The heat-dissipation layer 310 may have a thickness of at least 30 μm or greater in order to have an effective heat-dissipation effect.

A bent panel fixing member 400 is placed under the cushion plate 300.

The bent panel fixing member 400 serves to fix or connect the pad portion PAD to the cushion plate 300.

When bending the bent portion BND of the display panel 100 so that the pad portion PAD of the display panel 100 is placed under the bottom surface of the front portion FP of the display panel 100, a restoring force to restore the display panel 100 to a state before the display panel 100 is bent may be applied to the display panel 100.

When the restoring force acts strongly, the pad portion PAD of the bent display panel 100 may not be fixedly maintained but may be lifted.

The bent panel fixing member 400 is disposed between the front portion FP of the display panel 100 and the pad portion PAD thereof to fix or connect the bent display panel 100 such that the panel is maintained at the bent state.

The bent panel fixing member 400 is formed to have a certain thickness in a thickness direction of the bent portion. The bent panel fixing member 400 may be embodied as a double-sided tape with strong adhesive strength that may secure bonding between the front portion FP of the display panel 100 and the pad portion PAD thereof.

Further, the bent panel fixing member 400 may be embodied as a foam tape, or a foam pad, and may function as a shock reduction member.

Further, the bent panel fixing member 400 may be embodied as a double-sided conductive tape having conductivity. For example, the double-sided conductive tape may include a conductive layer between an upper adhesive layer and a lower adhesive layer, and the adhesive layer may include a conductive material.

The display module 10 according to an embodiment of the present disclosure having such a configuration may have following advantageous effects.

First, according to an embodiment of the present disclosure, thinning the cushion portion of the cushion plate 300 disposed closer to the bent portion BND may allow reducing the bending radius of curvature such that the bezel area BZA may be reduced.

The cushion portion of the cushion plate 300 according to an embodiment of the present disclosure includes the first cushion portion 341 and the second cushion portion 342, wherein the second cushion portion 342 is spaced apart from the first cushion portion 341 and is disposed closer to the bent portion BND than the first cushion portion 341 is.

In this case, the second cushion portion 342 has a thickness smaller than that of the first cushion portion 341.

Therefore, when the pad portion PAD of the display panel 100 is bent toward the bottom surface of the display panel 100, the pad portion may be fixed to an area corresponding to the second cushion portion 342 thinner than the first cushion portion 341 via the bent panel fixing member 400, such that the radius of curvature of the bent portion may decrease.

When the bending radius of curvature is reduced in this way, the bezel area BZA may also be reduced.

Further, according to an embodiment of the present disclosure, when the step is formed on the heat-dissipation layer 310 bonded to the bottom surfaces of the first cushion portion 341 and the second cushion portion 342 having different thicknesses, a part of the tension may be applied to a portion of the heat-dissipation layer 310 corresponding to the first cushion portion 341 because the first cushion portion 341 and the second cushion portion 342 is spaced apart from each other. This may reduce the magnitude of the tension applied to a portion of the heat-dissipation layer 310 corresponding to the second cushion portion 342.

When the step is formed on the heat-dissipation layer 310 bonded to the bottom surfaces of the first cushion portion 341 and the second cushion portion 342 having different thicknesses, considerable tension may be applied to the heat-dissipation layer 310 due to the step.

The heat-dissipation layer 310 must be firmly adhered to the cushion portion. When the considerable tension is applied to the heat-dissipation layer 310, a defect may occur that the heat-dissipation layer 310 may not be firmly and uniformly fixed to the cushion portion.

However, in the display module 10 according to an embodiment of the present disclosure, the first cushion portion 341 and the second cushion portion 342 is spaced apart from each other. Thus, the tension acting on the heat-dissipation layer 310 may not be concentrated on the second cushion portion 342 but may be applied to the first cushion portion 341. Thus, the magnitude of the tension applied to a portion of the heat-dissipation layer 310 corresponding to the second cushion portion 342 may be reduced.

Further, according to an embodiment of the present disclosure, placing the second support layer 362 having a strong supporting force and formed of PET into the cushion plate 300 such that the second support layer 362 is in contact with the heat-dissipation layer 310 may allow minimizing the unevenness defect on the cushion plate 300, compared to a structure in which the cushion layer including the foam pad having a weak supporting force contacts the heat-dissipation layer 310.

Figure 5A:
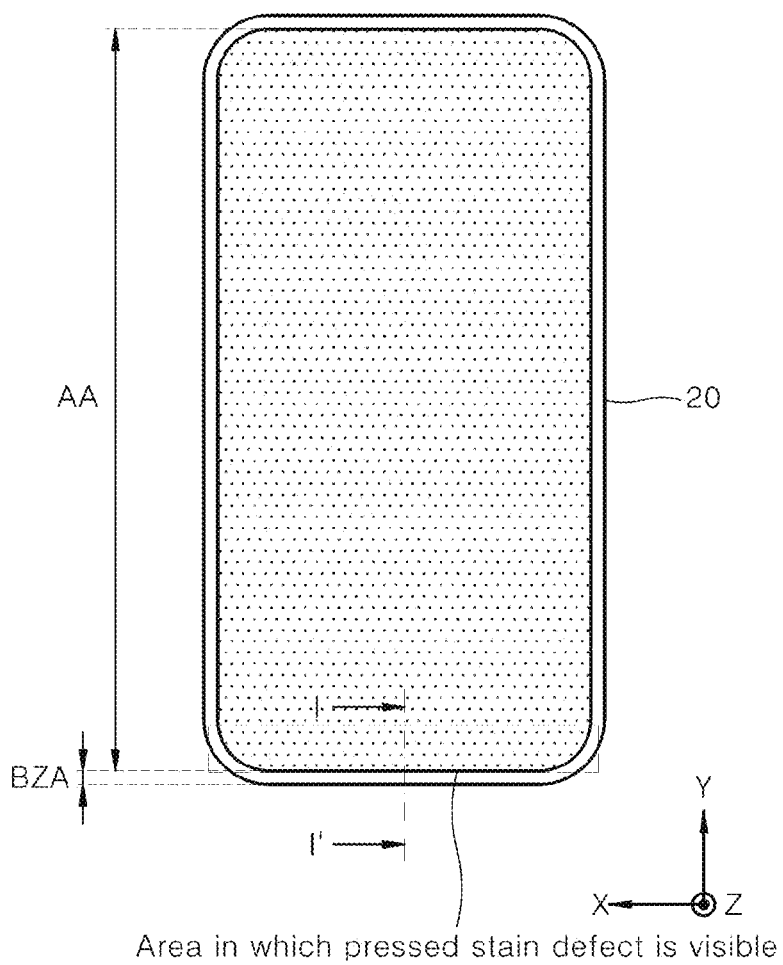
FIG. 5A shows an area in which a pressed stain defect is visible on a front surface of a display device.
Figure 5B:
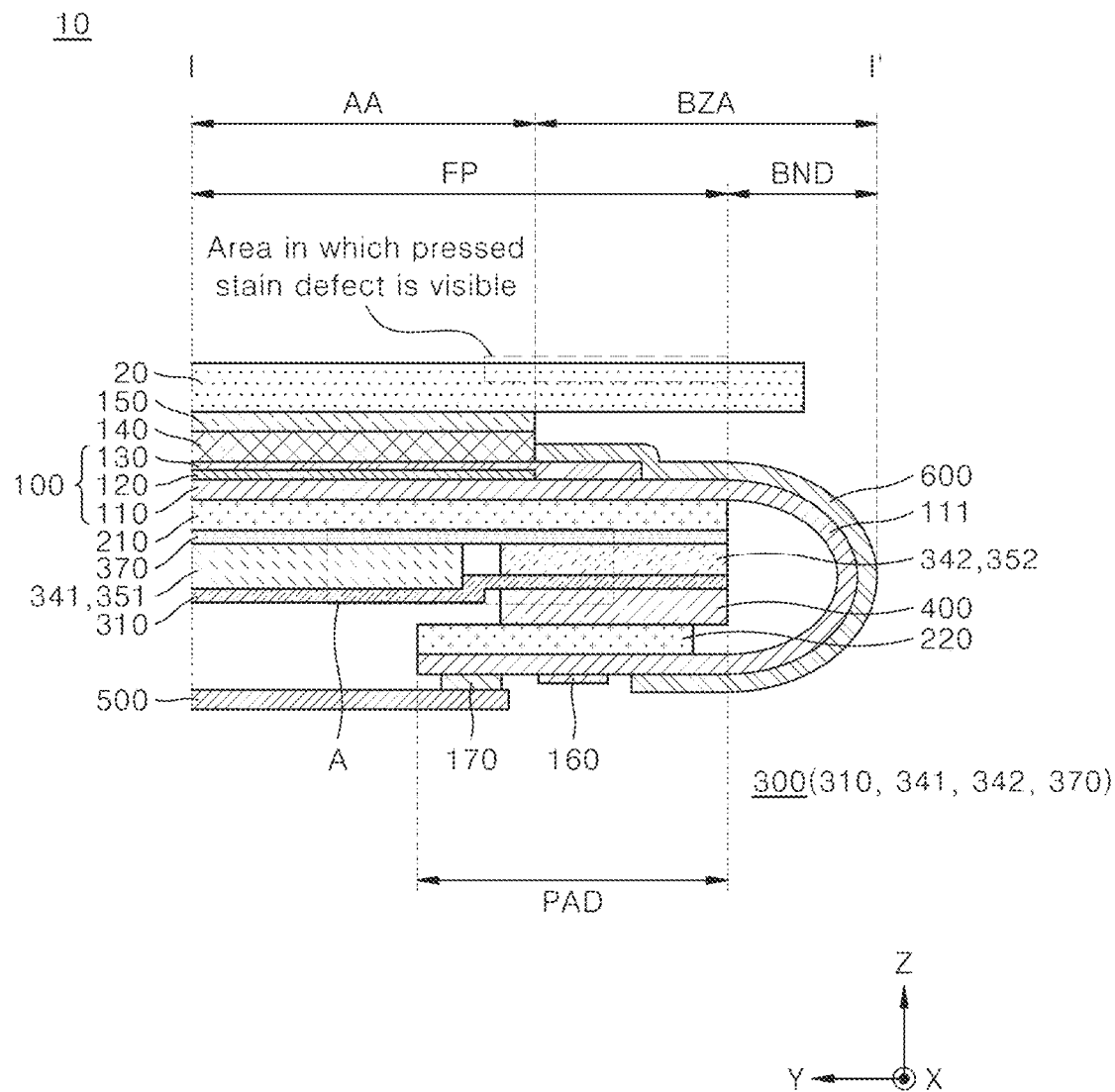
FIG. 5B is a cross-sectional view of a general display device on which a pressed stain defect occurs.

In order to reduce the bending radius of curvature of the bezel area BZA, the thickness of the second cushion portion 342 closer to the bezel area BZA may be smaller as shown in FIG. 5B. Accordingly, the heat-dissipation layer 310 adhered to a bottom surface of the second cushion portion 342 has a step.

In FIG. 5B, the second cushion portion 342 may be composed of a single layer as the second cushion layer 352, and may be embodied as a foam pad having a predefined thickness.

While the step is present, a strong tension is applied to the heat-dissipation layer 310 bonded to the second cushion portion 342, that is, the second cushion layer 352.

Figure 5C:
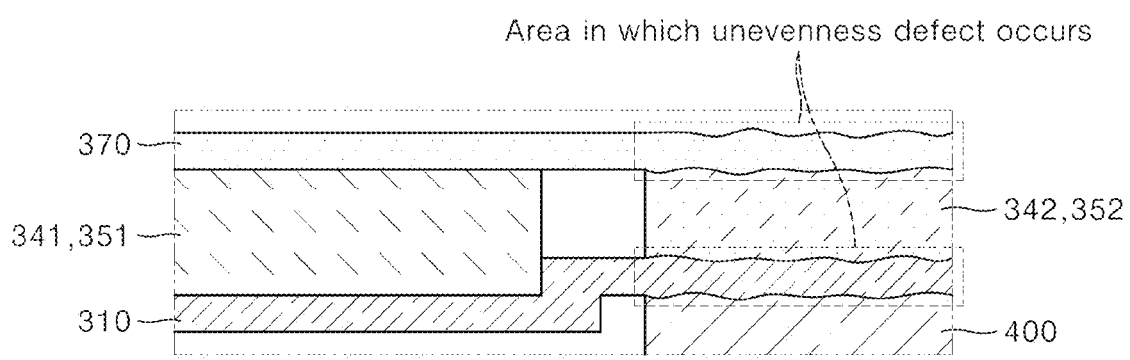
FIG. 5C is an enlarged cross-sectional view showing an area where an unevenness defect occurs on a general cushion plate.

As the strong tension acts on the heat-dissipation layer 310 in this way, the heat-dissipation layer 310 may not be uniformly and flatly adhered to the second cushion layer 352 and thus may have an unevenness defect, as shown in FIG. 5C.

In this case, the unevenness defect occurs not only between the heat-dissipation layer 310 and the second cushion layer 352, but also between the embossed layer 370 and the second cushion layer 352.

This is, when the tension is applied to the heat-dissipation layer 310, not only the tension may be applied to the second cushion layer 352 that directly contacts the heat-dissipation layer 310, but also the embossed layer 370 in contact with the second cushion layer 352 is affected by the tension from the heat-dissipation layer 310. Thus, the unevenness defect also occurs between the embossed layer 370 and the second cushion layer 352.

In particular, when the pad portion PAD of the display panel 100 is bent to be positioned on the bottom surface of the display panel 100, the pad portion PAD of the bent display panel 100 presses the second cushion layer 352. Due to this additional pressure, the unevenness defect becomes more severe.

When this unevenness defect becomes severe, as shown in FIG. 5A and FIG. 5B, the user of the display device visually recognizes an internal pressed stain defect around the area pressed by the pad portion PAD of the bent display panel 100.

In other words, the pressed stain defect occurs in an area closer to the bent portion BND as a lower end of the display device.

Accordingly, in an embodiment according to the present disclosure, the second cushion portion 342 may be formed in consideration of material characteristics of each of the layers which the second cushion portion 342 of the cushion plate 300 contacts.

Specifically, since the top surface of the second cushion portion 342 is in contact with the embossed layer 370 formed of a soft material, the top surface of the second cushion portion 342 is in contact with the second cushion layer 352. Since the bottom surface of the second cushion portion 342 is in contact with the dissipation layer 310 formed of a hard material, the bottom surface of the second cushion portion 342 is in contact with the second support layer 362.

Placing the second support layer 362 having a strong supporting force and formed of PET so as to be in contact with the heat-dissipation layer 310 may allow the heat-dissipation layer 310 to be adhered to the second support layer 362 in a state as flat as possible and to be restored to a flat state, thereby minimizing the unevenness defects.

As the unevenness defect between the heat-dissipation layer 310 and the second support layer 362 is minimized, the unevenness defect between the second cushion layer 352 and the embossed layer 370 positioned on a top thereof may also be minimized.

Eventually, the display module 10 according to an embodiment of the present disclosure has minimized unevenness defect on the cushion plate 300 compared to a structure in which a cushion layer including a foam pad having a weak supporting force contacts the heat-dissipation layer 310.

Further, when the pad portion PAD of the display panel 100 is bent to be placed on the bottom surface of the display panel 100, the pad portion PAD of the bent display panel 100 presses the cushion layer. This additional pressure may cause the unevenness defect to be severe.

When such an unevenness defect becomes severe, a problem may arise in that the user of the display device visually recognizes the internal pressed stain around the area pressed by the pad portion PAD of the bent display panel 100.

However, in the display module 10 according to an embodiment of the present disclosure, when the pad portion PAD of the bent display panel 100 presses the cushion portion, the unevenness defect in the cushion plate 300 may be minimized because the second support layer 362 having a strong supporting force and formed of PET may be disposed in the cushion plate 300 such that the second support layer 362 is in contact with the heat-dissipation layer 310. Thus, the visibility of the internal pressed stain to the user may be minimized.

Figure 6A:
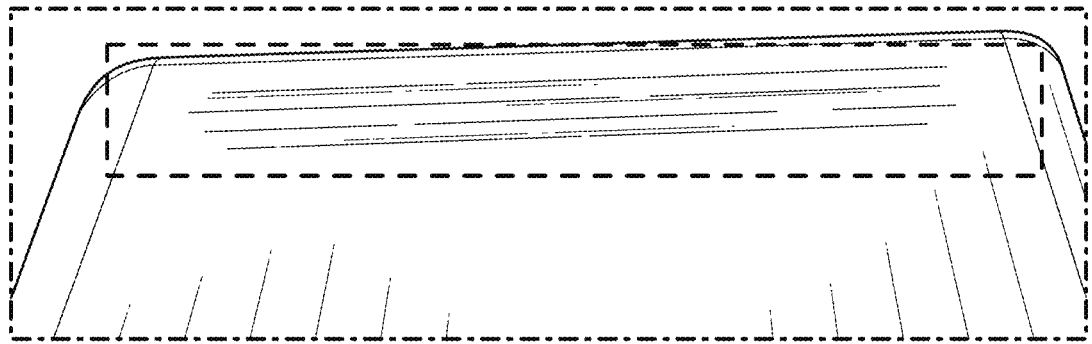
FIG. 6A and FIG. 6B are views of visibility of a pressed stain defect on front surfaces of a display device according to Comparative Example and a display device according to an embodiment of the present disclosure, respectively.
Figure 6B:
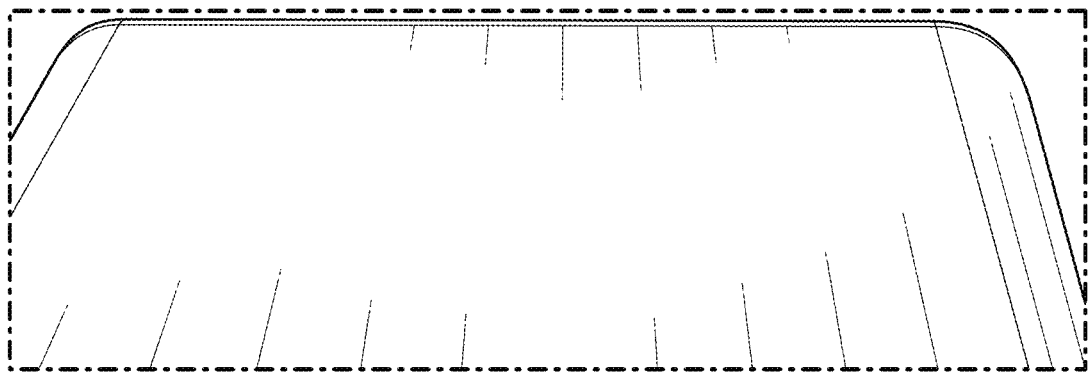

FIG. 6A and FIG. 6B are views of visibility of a pressed stain defect on front surfaces of a display device according to Comparative Example and a display device according to an embodiment of the present disclosure, respectively.

FIG. 6A shows an image of the bent portion BND in Comparative Example in which, as in FIG. 5B, the second cushion portion 342 is composed of the second cushion layer 352, and the second cushion layer 352 is in direct contact with the lower heat-dissipation layer 310.

As may be seen in FIG. 6A, the pressed stain defect is clearly visible in the BND area of the bent portion.

On the contrary, FIG. 6B shows an image of the bent portion BND in the embodiment of the present disclosure in which as in FIG. 2, the second cushion portion 342 is composed of the second support layer 362 and the second cushion layer 352, and the second support layer 362 is in direct contact with the lower heat-dissipation layer 310.

As may be seen in FIG. 6B, it may be seen that the pressed stain defect is hardly recognized not only in the bent portion BND but also in other areas than the bent portion BND.

Figure 7A:
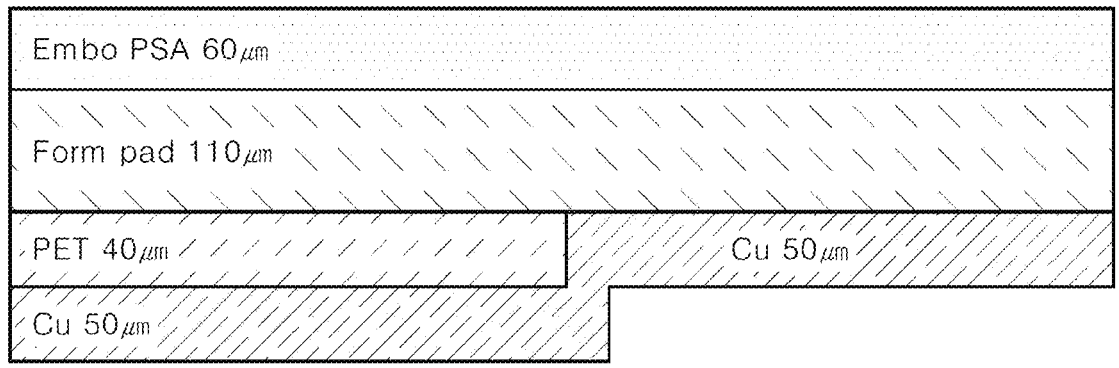
FIG. 7A to FIG. 7D are cross-sectional views of a cushion plate according to Comparative Example.
Figure 7B:
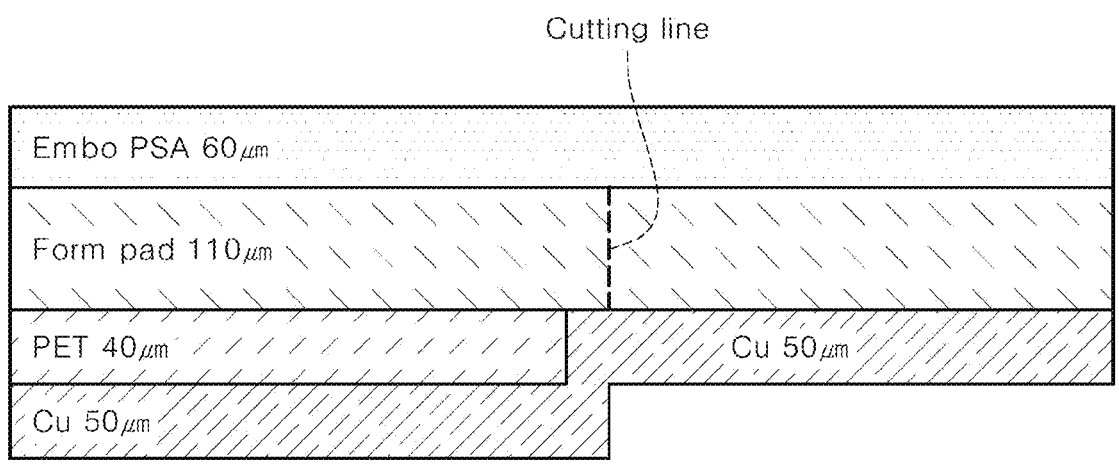
Figure 7C:
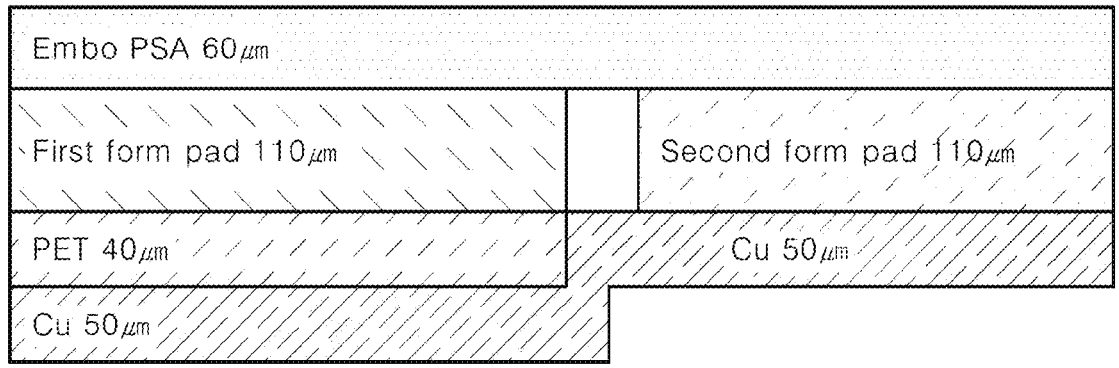
Figure 7D:
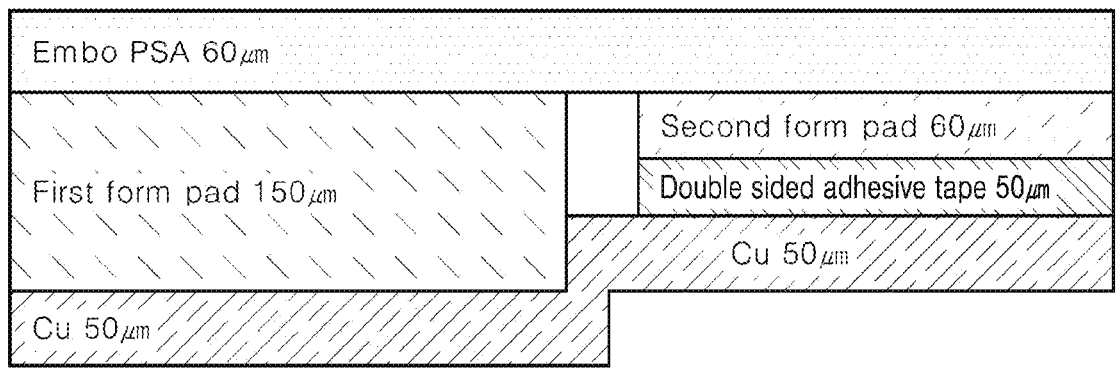
Figure 7E:
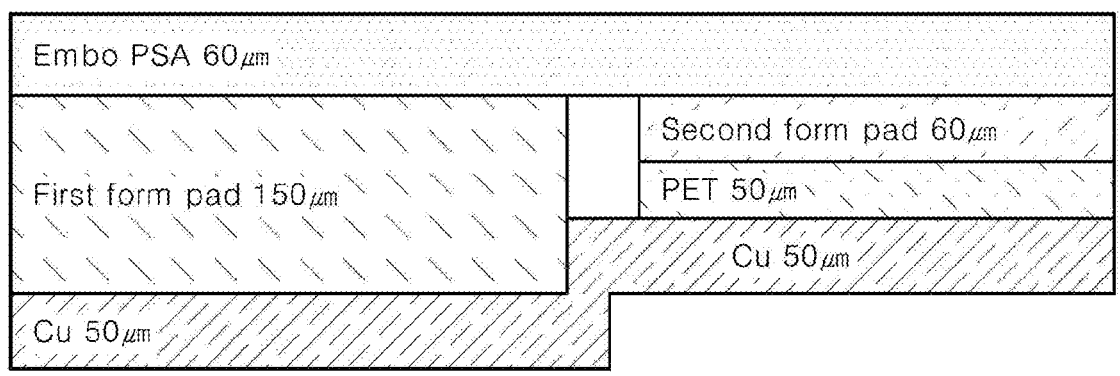
FIG. 7E is a cross-sectional view of a cushion plate according to an embodiment of the present disclosure.

FIG. 7A to FIG. 7D are cross-sectional views of a cushion plate according to Comparative Example, and FIG. 7E is a cross-sectional view of a cushion plate according to an embodiment of the present disclosure.

Hereinafter, the cushion plates 300 according to FIG. 7A to FIG. 7E are applied to the display module 10. Then, it is identified whether or not the pressed stain is visually recognized in the display module 10.

In order to identify whether the pressed stain is visible or not, the visibility level is classified into five levels: high, high-middle, middle, low-middle, and low levels which are identified using a naked eye.

Each of the cushion plates 300 in FIGS. 7A to 7E includes an embossed pressure-sensitive adhesive Embo PSA having a thickness of 60 µm and a copper-based heat-dissipation layer 310 having a thickness of 50 µm. A portion of the copper-based heat-dissipation layer 310 closer to the bent portion BND has a step.

In each of the cushion plates 300 of FIGS. 7A to 7E, an area closer to the bent portion BND of the display panel 100 is defined as a right area.

However, the cushion plates 300 of FIGS. 7A to 7E have different configurations of a cushion portion disposed between the embossed pressure-sensitive adhesive Embo PSA and the copper-based heat-dissipation layer 310.

The cushion plate 300 according to FIG. 7A has a foam pad with a thickness of 110 µm as a cushion portion. A PET film with a thickness of 40 µm is formed only under a partial area of the foam pad far away from the bent portion BND. In an area closer to the bent portion BND, the foam pad is in direct contact with the copper-based heat-dissipation layer 310.

In the case of FIG. 7A, the visibility level of the pressed stain in the area closer to the bent portion BND is identified as a high-middle level or a middle level.

The cushion plate 300 according to FIG. 7B has the same structure as the cushion plate 300 according to FIG. 7A, except that the foam pad is cut along a cutting line in FIG. 7B.

In the case of FIG. 7B, the visibility level of the pressed stain in the area closer to the bent portion BND is identified as a high-middle level or a middle level. This is similar to that in FIG. 7A.

Thus, it may be identified that the pressed stain defect is not reduced by simply cutting the foam pad.

The cushion plate 300 according to FIG. 7C has the same structure as that of the cushion plate 300 according to FIG. 7A, except that the foam pad is divided into the first foam pad and the second foam pad which are spaced from each other.

In the case of FIG. 7C, the visibility level of the pressed stain in the area closer to the bent portion BND is identified as a middle level or a low level.

Thus, when the foam pads are spaced apart from each other, and even when the underlying copper-based heat-dissipation layer 310 has the step, the pressed stain defect is reduced as the tension applied to the heat-dissipation layer decreases.

In the cushion plate 300 according to FIG. 7D, the foam pad is divided into the first foam pad and the second foam pad which are spaced apart from each other. The first foam pad has a thickness of 150 μm and directly contacts the embossed PSA and the copper-based heat-dissipation layer 310. The second foam pad has a thickness of 60 μm and contacts the embossed PSA, but does not directly contact the copper-based heat-dissipation layer 310 and is bonded to the copper-based heat-dissipation layer via a double-sided adhesive tape having a thickness of 50 μm.

In this case, the second foam pad is placed in the area closer to the bent portion BND.

In the case of FIG. 7D, the visibility level of the pressed stain in the area closer to the bent portion BND is identified as a low level.

Thus, when the second foam pad does not directly contact the copper-based heat-dissipation layer 310, but is in contact with the copper-based heat-dissipation layer 310 via the double-sided adhesive tape having a predefined thickness, the pressed stain defect may be reduced to some extent.

The cushion plate 300 according to FIG. 7E has the same structure as that of the cushion plate 300 according to FIG. 7D, and differs from the cushion plate 300 according to FIG. 7D in that in FIG. 7E, the PET film is used instead of the double-sided adhesive tape.

In the case of FIG. 7E, the visibility level of the pressed stain in the area closer to the bent portion BND is identified as a very low level, or the pressed stain is substantially invisible.

Thus, when the second foam pad does not directly contact the copper-based heat-dissipation layer 310 but contacts the copper-based heat-dissipation layer 310 via a hard support layer such as a PET layer having a predefined thickness, the stain defect is significantly reduced.

Thus, in the case of the cushion plate 300 according to an embodiment of the present disclosure, the second support layer 362 having a strong supporting force such as the PET layer is placed to be in contact with the heat-dissipation layer 310, thereby minimizing the unevenness defect on the cushion plate 300, compared to a structure in which the cushion layer having a weak supporting force such as the foam pad contacts the heat-dissipation layer 310.

Figure 3:
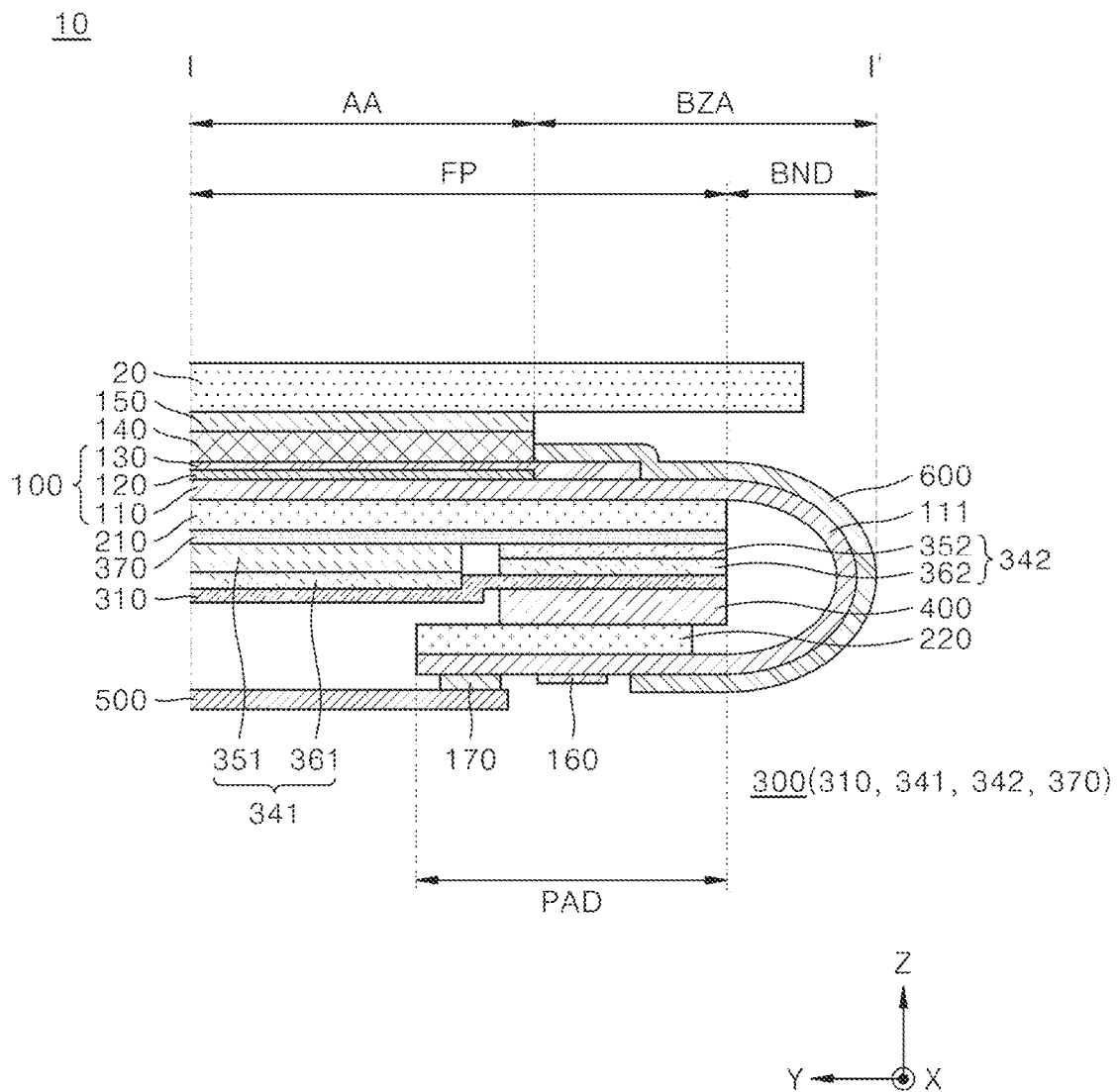
FIG. 3 is a cross-sectional view of a display module according to another embodiment of the present disclosure.

In one example, a display module 10 according to another embodiment of the present disclosure may have an arrangement structure of the cushion plate 300 as shown in FIG. 3. The embodiment according to FIG. 3 is described based on differences from the embodiment according to FIG. 2, and redundant contents therebetween are omitted.

In the cushion plate 300 according to FIG. 3, the first cushion portion 341 further includes a first support layer 361.

That is, the first cushion portion 341 may include the first cushion layer 351 and the first support layer 361, the first cushion layer 351 may be in contact with the embossed layer 370, and the first support layer 361 may be in contact with the heat-dissipation layer 310.

In this case, the first support layer 361 and the second support layer 362 may have the same thickness and are on a same plane with respect to the heat-dissipation layer 310.

However, in this case, the second cushion layer 352 has a thickness smaller than that of the first cushion layer 351.

The first support layer 361 of the first cushion portion 341 may include a hard material that may impart a strong supporting force to the heat-dissipation layer 310 disposed on the bottom surface of the first support layer 361.

In one example, the first support layer 361 may include PET material. Although not shown in the drawings, the first support layer 361 may have a sequentially stacked structure of a first supporting adhesive layer, a first support body layer, and a second support adhesive layer.

In this way, when the first cushion portion 341 includes the first cushion layer 351 and the first support layer 361, and the first support layer 361 is in contact with the heat-dissipation layer 310, the heat-dissipation layer 310 is adhered to and is in direct contact with the hard first support layer 361. Thus, the heat-dissipation layer 310 may be adhered evenly and flatly thereto.

In particular, since the first support layer 361 is not connected to the second support layer 362 but is spaced apart therefrom, the tension applied to the heat-dissipation layer 310 having the step may be reduced.

For example, if the first support layer 361 and the second support layer 362 are connected to each other and is bonded to the heat-dissipation layer 310, the support layer as well as the heat-dissipation layer 310 have a step. Thus, as the thickness of each of the layers with the steps increases, the tension applied to the heat-dissipation layer 310 increases.

However, as in an embodiment of the present disclosure, when the first support layer 361 and the second support layer 362 are spaced apart from each other, the thickness of each of the layers having steps does not increase. Thus, the tension applied to the heat-dissipation layer 310 does not increase such that the heat-dissipation layer 310 may be uniformly and flatly bonded to the support layers.

In one example, a driving integrated circuit 160 may be disposed on an opposite surface of the pad portion PAD of the display panel 100 to one surface thereof on which the second backplate 220 is disposed.

In an embodiment according to the present disclosure, it is assumed that the driving integrated circuit 160 is embodied as COP (Chip On Plastic) mounted on the display substrate 110. However, embodiments of the present disclosure are not limited thereto.

The driving integrated circuit 160 may be mounted on the display substrate 110 using a chip bonding process or a surface mounting process. In the bent state, the driving integrated circuit 160 may be disposed on a bottom surface of the display substrate 110.

The driving integrated circuit 160 generates a data signal and a gate control signal based on image data and a timing synchronization signal supplied from an external host driving system. In addition, the driving integrated circuit 160 may supply the data signal to a data line of each pixel through the display pad, and may supply the gate control signal to a gate driving circuitry through the display pad.

That is, the driving integrated circuit 160 may be mounted on a chip mounting area defined on the display substrate 110 and may be electrically connected to the display pad, and may be connected to a signal line of each of the gate driving circuitry and the pixel array 120 disposed on the display substrate 110.

The display pad may be disposed on a distal end of the display substrate 110 on which the driving integrated circuit 160 is mounted. The display pad may include a plurality of display pads.

The display pad may be electrically connected to a flexible circuit board 500 on which a circuit board is mounted under the bottom surface of the display substrate 110.

The flexible circuit board 500 may be electrically connected to the display pad disposed on the distal end of the display substrate 110 via a conductive adhesive layer 170 using a film attaching process, and may be positioned under the bottom surface of the display panel 100.

In this case, the conductive adhesive layer 170 may be embodied as an ACF (Anisotropic Conductive Film) in one example.

The circuit board may provide the image data and the timing synchronization signal supplied from the host driving system to the driving integrated circuit 160, and may provide voltages necessary for driving the pixel array 120, the gate driving circuitry, and the driving integrated circuit 160 thereto, respectively.

In one example, a bent portion reinforcing member 600 may be disposed on an outer surface 111 of the bent portion BND of the display panel 100. The bent portion reinforcing member 600 may extend to cover the bent portion BND, and cover at least a partial area of the front portion FP and at least a partial area of the pad portion PAD.

The bent portion reinforcing member 600 may include resin which may be embodied as an ultraviolet (UV) curable acrylic resin. However, embodiments of the present disclosure are not limited thereto.

Specifically, the bent portion reinforcing member 600 may be formed of a cured product of a resin resulting from a curing process after coating the resin. When the resin includes an ultraviolet curable resin, the curing may be performed using UV.

The bent portion reinforcing member 600 may be disposed on the outer surface 111 of the display panel 100 to cover various signal lines between the encapsulation portion 130 of the display panel 100 and the display pad. Accordingly, the bent portion reinforcing member 600 may prevent moisture invasion into the signal line while protecting the signal line from external impact.

Further, since the bent portion reinforcing member 600 is disposed on the outer surface 111 of the bent portion BND, the rigidity of the display panel 100 in the bent portion BND from which the backplate (or a plate or a base plate) has been removed may be supplemented.

The display module according to an embodiment of the present disclosure described as described above includes a display panel including a front portion, a bent portion, and a pad portion extending from the bent portion and positioned under a bottom surface of the front portion; a cushion plate disposed between the front portion and the pad portion; and a connection member configured to connect the pad portion to the cushion plate.

In this case, the cushion plate includes an embossed layer; first and second cushion portions disposed under the embossed layer, the first cushion portion including a first cushion layer, and the second cushion portion including a second cushion layer and a second support layer; and a heat-dissipation layer disposed under the first cushion portion and the second cushion portion.

The second cushion portion has a thickness smaller than that of the first cushion portion, and is spaced apart from the first cushion portion and is closer to the bent portion than the first cushion portion is.

The second cushion layer is disposed on a top surface of the second support layer. The first cushion portion and the second cushion portion may be on a same plane with respect to the embossed layer.

The second cushion layer is thinner than the first cushion layer.

The second support layer includes polyethylene terephthalate (PET). The second support layer includes a first support adhesive layer, a second supporting body layer, and a second support adhesive layer. A thickness of the second support body layer is 40 μm or greater.

Each of the first cushion layer and the second cushion layer includes a foam tape or a foam pad.

The embossed layer includes an adhesive layer having an embossed pattern.

The heat-dissipation layer includes at least one of cupper (Cu), aluminum (Al), and graphite. The heat-dissipation layer has a step in an area thereof corresponding to the second cushion portion.

A top surface and a bottom surface of the first cushion portion are in contact with the embossed layer and the heat-dissipation layer, respectively.

The first cushion portion further includes a first support layer, the first cushion layer is in contact with the embossed layer, and the first support layer is in contact with the heat-dissipation layer.

The first support layer and the second support layer have the same thickness. The second cushion layer is thinner than the first cushion layer.

The second cushion layer is in contact with the embossed layer, and the second support layer is in contact with the heat-dissipation layer.

A display device according to an embodiment of the present disclosure includes a cover member, the display module according to an embodiment of the present disclosure coupled to a bottom surface of the cover member, and a frame disposed on a bottom surface of the display module to support the cover member.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The invention claimed is:

1. A display module, comprising:
   a display panel including a front portion, a bent portion, and a pad portion extending from the bent portion and positioned below a bottom surface of the front portion; and
   a cushion plate disposed between the front portion and the pad portion of the display panel,
   wherein the cushion plate includes:
      an embossed layer;
      a first cushion portion and a second cushion portion, the first cushion portion and the second cushion portion disposed under the embossed layer, wherein the first cushion portion includes a first cushion layer, and the second cushion portion includes a second cushion layer and a support layer; and a heat-dissipation layer disposed under the first cushion portion and a bottom surface of the second cushion portion, wherein the second cushion portion has a thickness that is less than a thickness of the first cushion portion, and the second cushion portion is spaced apart from the first cushion portion with the second cushion portion positioned closer to the bent portion than the first cushion portion.

2. The display module of claim 1, wherein the second cushion layer is disposed on the support layer.

3. The display module of claim 1, wherein the first cushion portion and the second cushion portion are on the same plane with respect to the embossed layer.

4. The display module of claim 1, wherein the second cushion layer is thinner than the first cushion layer.

5. The display module of claim 1, wherein the support layer includes polyethylene terephthalate (PET).

6. The display module of claim 1, wherein the support layer includes a first adhesive layer, a body layer, and a second adhesive layer, and wherein a thickness of the body layer is 40 μm or greater.

7. The display module of claim 1, wherein each of the first cushion layer and the second cushion layer includes a foam tape or a foam pad.

8. The display module of claim 1, wherein the embossed layer includes an adhesive layer having an embossed pattern.

9. The display module of claim 1, wherein the heat-dissipation layer includes at least one of cupper (Cu), aluminum (Al), and graphite.

10. The display module of claim 1, wherein the heat-dissipation layer has a step between the first cushion portion and the second cushion portion.

11. The display module of claim 1, wherein a top surface and a bottom surface of the first cushion portion are in contact with the embossed layer and the heat-dissipation layer, respectively.

12. The display module of claim 11, wherein the first cushion portion includes a first support layer, the support layer of the second cushion portion being a second support layer, wherein the first cushion layer is disposed on the first support layer.

13. The display module of claim 12, wherein the first support layer and the second support layer have the same thickness.

14. The display module of claim 12, wherein the second cushion layer is thinner than the first cushion layer.

15. The display module of claim 1, further comprising:
a plate disposed between the heat-dissipation layer and the pad portion of the display panel.

16. The display module of claim 1, further comprising:
a connection member configured to connect the pad portion to the cushion plate.

17. A display device, comprising:
a cover member;
a display module coupled to a bottom surface of the cover member; and
a frame disposed on a bottom surface of the display module to support the cover member,
wherein the display module includes:
a display panel including a front portion, a bent portion, and a pad portion extending from the bent portion and positioned below a bottom surface of the front portion;
a cushion plate disposed between the front portion and the pad portion; and
a connection member configured to connect the pad portion to the cushion plate,
wherein the cushion plate includes:
an embossed layer;
first and second cushion portions disposed on a bottom surface of the embossed layer, wherein the first cushion portion includes a first cushion layer, and the second cushion portion includes a second cushion layer and a second support layer; and
a heat-dissipation layer disposed on a bottom surface of the first cushion portion and the second cushion portion,
wherein the second cushion portion has a thickness smaller than a thickness of the first cushion portion, and is spaced apart from the first cushion portion and is closer to the bent portion than the first cushion portion.

* * * * *